(12) United States Patent
Quach et al.

(10) Patent No.: US 8,842,490 B2
(45) Date of Patent: Sep. 23, 2014

(54) APPARATUS AND METHOD FOR SELECTIVELY USING A MEMORY COMMAND CLOCK AS A REFERENCE CLOCK

(75) Inventors: Tuan M. Quach, Fullerton, CA (US); Cuong D. Dinh, Fountain Valley, CA (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 13/537,696

(22) Filed: Jun. 29, 2012

(65) Prior Publication Data

US 2014/0003182 A1    Jan. 2, 2014

(51) Int. Cl.
*G11C 8/00*    (2006.01)

(52) U.S. Cl.
USPC ..................................... 365/230.02

(58) Field of Classification Search
USPC ..................................... 365/230.02
See application file for complete search history.

(56) References Cited

U.S. PATENT DOCUMENTS

| 5,894,312 | A * | 4/1999 | Ishiwata et al. ............... 345/504 |
| 6,741,109 | B1 * | 5/2004 | Huang et al. .................. 327/156 |
| 8,200,862 | B2 * | 6/2012 | Lee et al. ........................ 710/62 |
| 2006/0080058 | A1 * | 4/2006 | Zimmerman et al. ........ 702/117 |
| 2006/0149982 | A1 * | 7/2006 | Vogt ............................... 713/320 |
| 2006/0195631 | A1 * | 8/2006 | Rajamani ........................ 710/51 |
| 2008/0059831 | A1 * | 3/2008 | Campbell ...................... 713/600 |
| 2009/0006776 | A1 * | 1/2009 | Spry et al. ..................... 711/154 |
| 2009/0013108 | A1 * | 1/2009 | Rajamani ........................ 710/71 |
| 2010/0005281 | A1 * | 1/2010 | Buchmann et al. .............. 713/2 |
| 2010/0275037 | A1 * | 10/2010 | Lee et al. ...................... 713/189 |
| 2011/0016267 | A1 * | 1/2011 | Lee et al. ...................... 711/103 |
| 2011/0273334 | A1 * | 11/2011 | Karr ............................. 342/378 |

* cited by examiner

*Primary Examiner* — Hoai V Ho
*Assistant Examiner* — Pablo Huerta
(74) *Attorney, Agent, or Firm* — Schwabe, Williamson & Wyatt, P.C.

(57) ABSTRACT

Described herein are embodiments of selectively setting a memory command clock as a memory buffer reference clock. An apparatus configured for setting a memory command clock as a memory buffer reference clock may include a memory buffer configured to interface between a host and memory, and reference clock selection logic configured to selectively set a memory command clock as a memory buffer reference clock. Other embodiments may be described and/or claimed.

27 Claims, 6 Drawing Sheets

US 8,842,490 B2

APPARATUS AND METHOD FOR SELECTIVELY USING A MEMORY COMMAND CLOCK AS A REFERENCE CLOCK

TECHNICAL FIELD

Embodiments of the present disclosure relate generally to the field of memory, and more particularly, to memory buffers configured to selectively use a memory command clock as a reference clock.

BACKGROUND

In some double-data rate (DDR) memory systems, command busses are trained using a link training procedure on power-on of the system to align the command slots targeting specific memory channels. Training a link may refer to aligning signals in the link between system memory and a memory controller, or a processor including memory control logic, to as close to optimal positions as possible.

After power-on of the system, a system reference clock, usually provided by a common clock source (e.g., an oscillator mounted on the system level board), may start toggling. This system reference clock may be provided to the processor and a memory buffer between the processor and the system memory for use a reference clock. This reference clock may be used for generating internal clocks such as, for example, internal memory buffer clocks and clocks to one or more memory modules. Although this reference clock may be suitable for many applications, the frequency of the reference clock may be relatively slow, which sometimes leads to clock jitter and long-term drift for internally-generated clocks.

BRIEF DESCRIPTION OF THE DRAWINGS

Embodiments of the present disclosure will be described by way of example embodiments, but not limitations, illustrated in the accompanying drawings in which like references denote similar elements, and in which.

Figure 1:
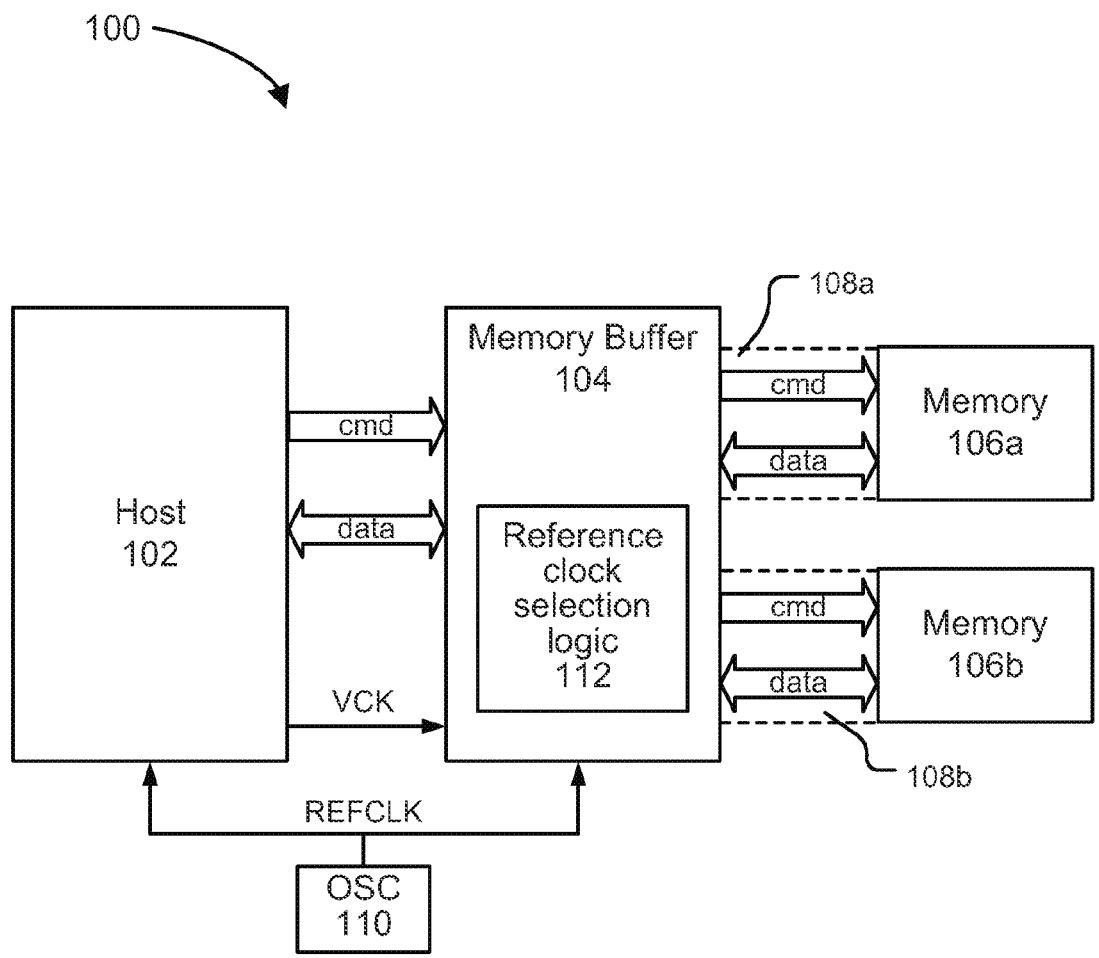
FIG. 1 illustrates an example computing system including reference clock selection logic for selectively setting a memory command clock as a reference clock in which the reference clock selection logic is integrated with the memory buffer.

all in accordance with embodiments of the present disclosure.

DETAILED DESCRIPTION

Described herein are embodiments of reference clock selection logic for selectively setting a memory command clock as a reference clock, a system including reference clock selection logic for selectively setting a memory command clock as a reference clock, a method for selectively setting a memory command clock as a reference clock, and computer-readable media having instructions that, if executed by one or more processors, cause an apparatus to perform a method for selectively setting a memory command clock as a reference clock.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various aspects of the illustrative implementations are described herein using terms commonly employed by those skilled in the art to convey the substance of their work to others skilled in the art. It will be apparent to those skilled in the art, however, that embodiments of the present invention may be practiced with only some of the described aspects. For purposes of explanation, specific numbers, materials and configurations are set forth in order to provide a thorough understanding of the illustrative implementations. It will be apparent to one skilled in the art, however, that embodiments of the present invention may be practiced without the specific details. In other instances, well-known features are omitted or simplified in order not to obscure the illustrative implementations.

Further, various operations are described as multiple discrete operations, in turn, in a manner that is most helpful in understanding the illustrative embodiments; however, the order of description should not be construed as to imply that these operations are necessarily order dependent. In particular, these operations need not be performed in the order of presentation. Moreover, methods within the scope of this disclosure may include more or fewer steps than those described.

For the purposes of the present disclosure, the phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

The description may use the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various entities may be introduced and described with respect to the operations they perform. It will be understood that these entities may include hardware, software, and/or firmware elements that are cooperatively configured to provide the described operations.

FIG. 1 illustrates an example computing system 100 configured to selectively set a memory command clock as a reference clock, in accordance with various embodiments. The system 100 may include a host 102 coupled with a memory buffer 104. The memory buffer 104 may interface between the host 102 and a plurality of memory modules 106a, 106b by a link including channels 108a, 108b to transmit commands to the memory modules 106a, 106b over a command bus and data between the memory buffer 104 and the memory modules 106a, 106b over a data bus. The memory buffer 104 may be located in a chipset of the system 100 or may be in a discrete component coupled to the memory modules 106a, 106b.

In various embodiments, the host 102 comprises one or more processors. The one or more processors may include one core or multiple cores. In some embodiments, the system 100 may be a multiprocessor system where each of the processors has one or multiple cores. In various embodiments, the host 102 includes an embedded a memory controller, but in other embodiments, a memory controller (not shown) may be included a chipset of the system 100. In other embodiments, the host 102 may be an entity, e.g., an application, an operating system, etc., that generates data and memory access commands and transmits the data and memory access commands to the memory buffer 104. As used herein, memory access commands may include requests for a memory access, e.g., a read, a write, etc., directed to one or more of the memory modules 106a, 106b via the memory buffer 104.

The memory modules 106a, 106b may each comprise double data rate (DDR) memory. In various ones of these embodiments, the memory modules 106a, 106b may be DDR synchronous dynamic random access memory (SDRAM). In other embodiments, the memory modules 106a, 106b may be another type of memory such as graphics DDR memory. In various embodiments, the memory modules 106a, 106b may be coupled to the host 102 via the memory buffer 104 by a voltage-mode, single-ended command bus (VMSE). Although two memory modules 106a, 106b are illustrated, other embodiments may include fewer or more memory modules than that illustrated.

After power-on of the system 100, a system reference clock (REFCLK) may be provided to the host 102 and the memory buffer 104, and a memory command clock (VCK) may be provided to the memory buffer 104 by the host 102. In various embodiments, the system reference clock REFCLK may be provided by a common clock source such as an oscillator 110. After the system reference clock REFCLK is provided to the host 102, the command busses may be trained using a link training procedure to align the command slots targeting specific memory channels 108a, 108b.

In various embodiments, the memory link training may include one or more operations for selectively setting the memory command clock VCK as the memory buffer reference clock, rather than defaulting to using the system reference clock REFCLK as the reference clock for the memory buffer 104. In some embodiments, the memory command clock VCK may have a higher frequency than the system reference clock REFCLK. For example, in some embodiments of the system 100, the system reference clock REFCLK may be a 100 MHz reference clock, while the memory command clock VCK may have a frequency up to 1600 MHZ or more. As such, using the memory command clock VCK as the memory buffer reference clock may advantageously reduce clock jitter and long-term drift for other clocks internally generated by the memory buffer 104. To that end, the system 100 may include reference clock selection logic 112 configured to selectively set a memory command clock VCK as the reference clock for the memory buffer 104.

Figure 2:
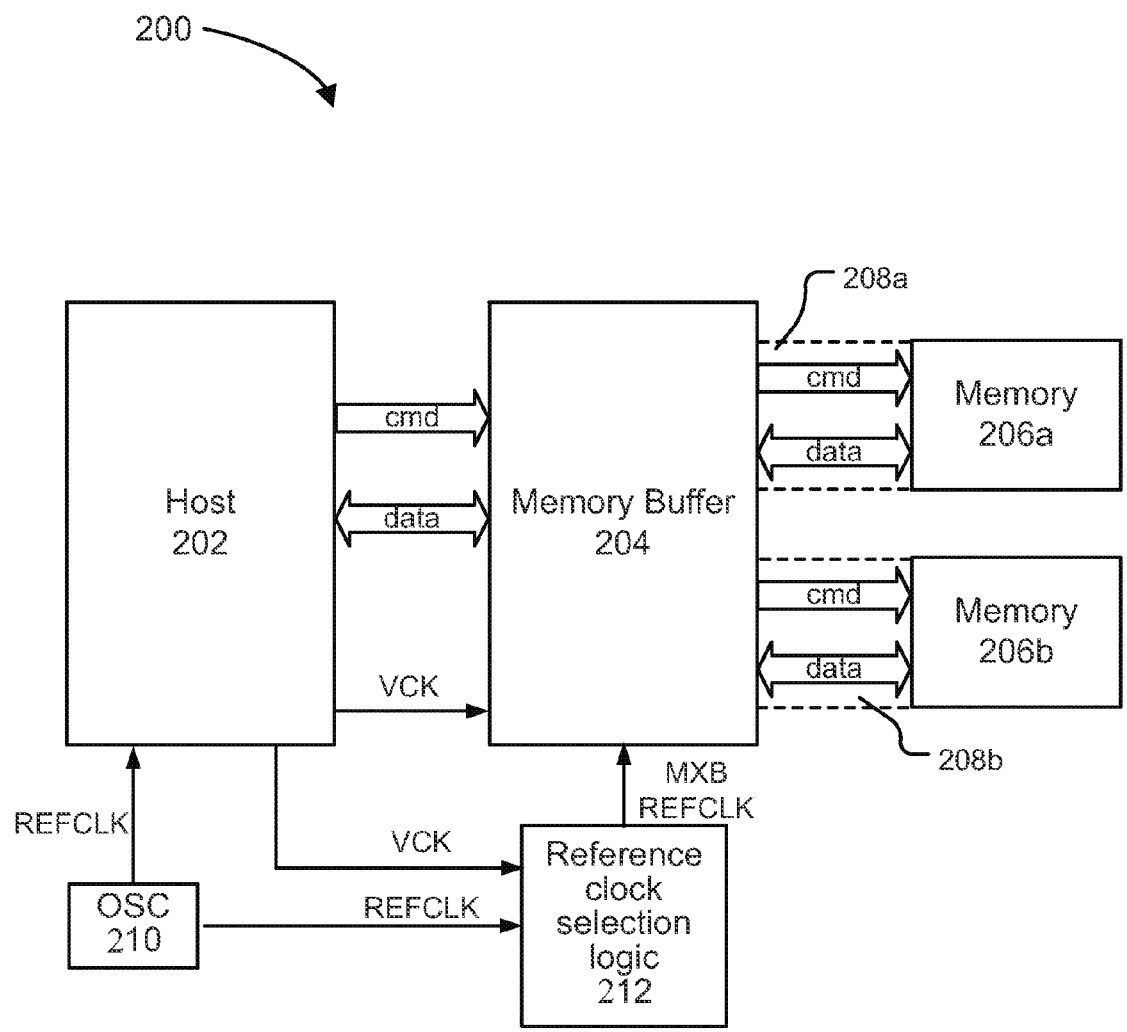
FIG. 2 illustrates another example computing system including reference clock selection logic for selectively setting a memory command clock as a reference clock in which the reference clock selection logic is separate from the memory buffer.

Although FIG. 1 shows the reference clock selection logic 112 integrated in the memory buffer 104, other embodiments include the reference clock selection logic as separate from the memory buffer. As shown in FIG. 2, for example, the reference clock selection logic 212 is a discrete component separate from the memory buffer 204 and coupled to receive the system reference clock REFCLK from the oscillator 210 and the memory command clock VCK from the host 202. In various ones of these embodiments, the reference clock selection logic 212 may be located in a chipset of the system 200. The system 200 may include other components similar to those of the system 100 of FIG. 1. For example, the memory buffer 204 may interface between the host 202 and a plurality of memory modules 206a, 206b by a link including channels 208a, 208b to transmit commands to the memory modules 206a, 206b over a command bus and data between the memory buffer 204 and the memory modules 206a, 206b over a data bus.

Figure 3:
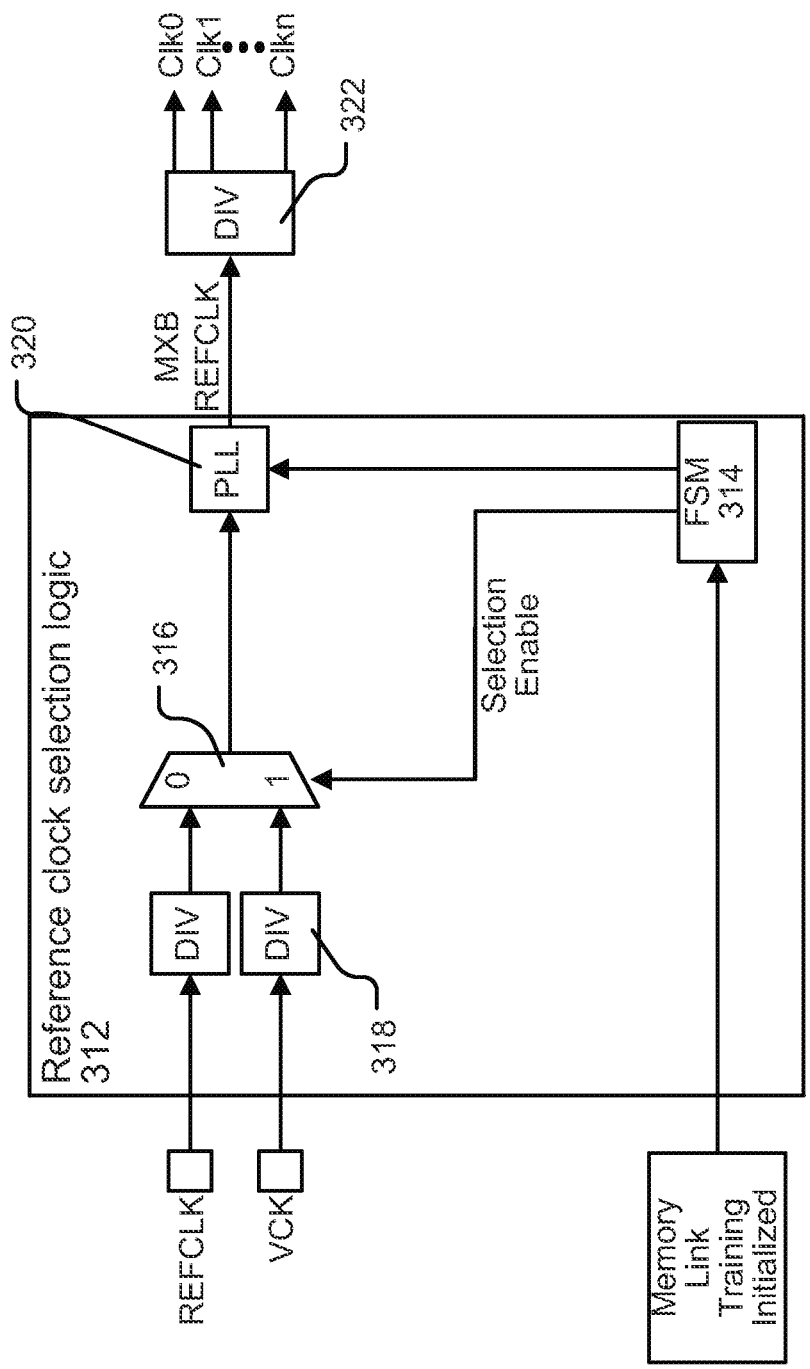
FIG. 3 illustrates an example of reference clock selection logic for selectively setting a memory command clock as a reference clock.

FIG. 3 illustrates an example of reference clock selection logic 312, which may represent the reference clock selection logic 112 of FIG. 1 or the reference clock selection logic 212 of FIG. 2. The reference clock selection logic 312 may be configured for selectively setting a memory command clock VCK as a memory buffer reference clock. A finite state machine (FSM) 314 may be configured to provide a reference clock selection enable signal to a multiplexer 316. In various embodiments, a memory buffer may be configured to cause the FSM 314 to initiate the reference clock switch by a control/status register (CSR) bit set by the memory buffer.

The multiplexer 316 may include inputs configured to receive a system reference clock REFCLK and a memory command clock VCK, and may be configured to selectively output the memory command clock VCK as the memory buffer reference clock MXB REFCLK in response to the reference clock selection enable signal. In various embodiments, the reference clock selection logic 312 may include one or more clock dividers 318 configured to divide one or both of the system reference clock REFCLK and the memory command clock VCK prior to providing the clock(s) to the multiplexer 316.

In various embodiments, the memory command clock VCK (as memory buffer reference clock MXB REFCLK) is provided to a phase-locked loop (PLL) 320 coupled to the output of the multiplexer 316. If the PLL locks the memory command clock VCK, then the PLL 320 will provide the memory command clock VCK for use the memory buffer reference clock. In various embodiments, the memory buffer reference clock may be provided to a clock divider 322 configured to divide the clock and generate one or more additional clocks Clk0, Clk1, . . . Clkn. For example, in some embodiments, one or more of a core clock, data clock, I/O clock, etc., may be generated.

If, however, the PLL fails to lock the memory command clock VCK, then the reference clock selection logic 312 is configured to cause the multiplexer to output the system reference clock REFCLK as the memory buffer reference clock. The FSM 314 may be configured to provide another selection enable signal to the multiplexer 316, based on the PLL lock failure, to cause the multiplexer to output the system reference clock REFCLK as the memory buffer reference clock. In various embodiments, a basic input/output service (BIOS) of the computing system may determine whether the PLL is locked, and cause the FSM 314 to provide another selection enable signal to the multiplexer 316.

Figure 4:
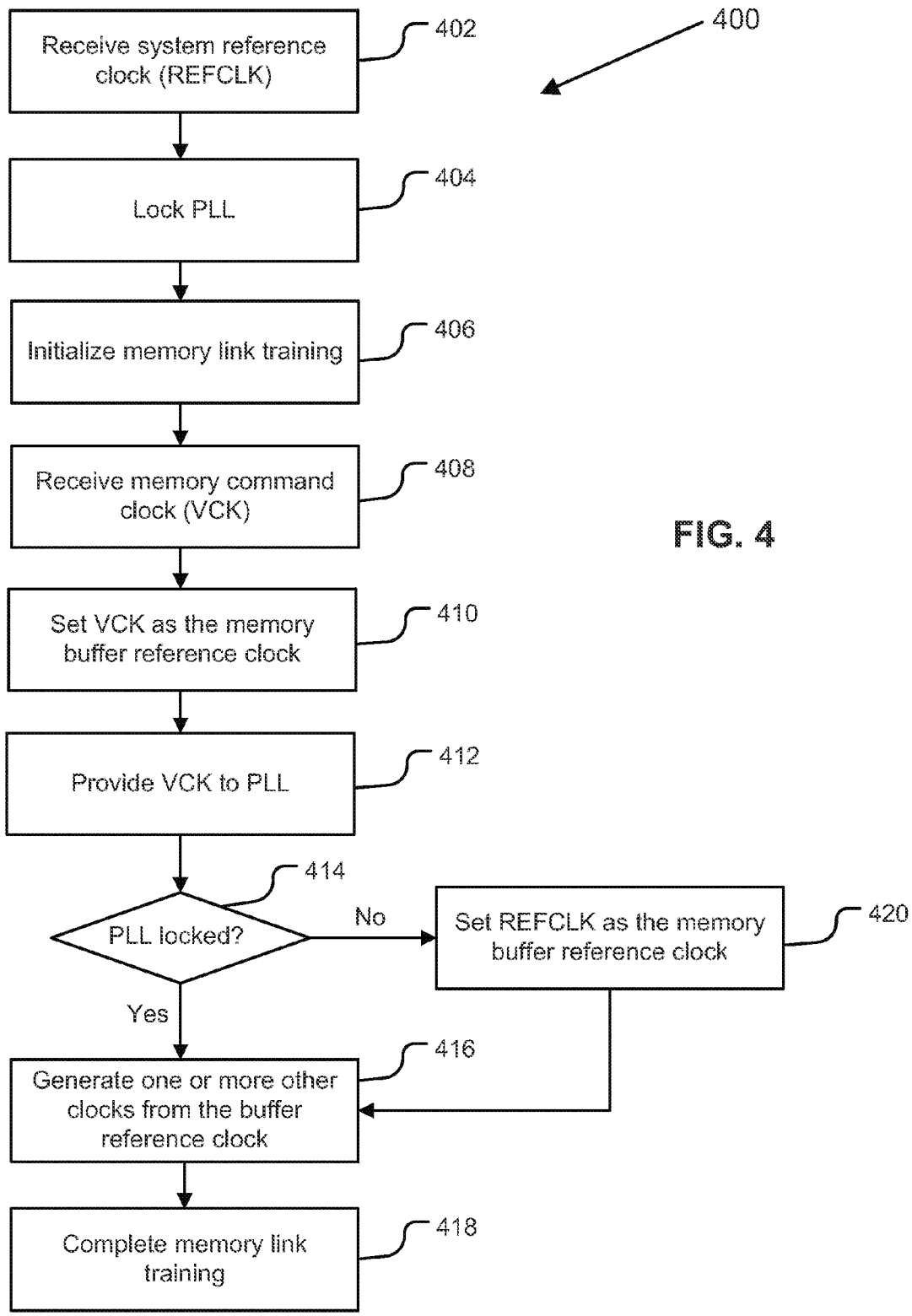
FIG. 4 is a flow chart depicting a method for selectively setting a memory command clock as a reference clock.

FIG. 4 is a flow chart depicting a method 400 for selectively setting a memory command clock as a reference clock, which may be performed by a computing system (such as, for example, computing system 100 or 200) in accordance with the embodiments described herein. The method 400 may include one or more functions, operations, or actions as is illustrated by block 402-420.

Processing for the method 400 may start with block 402 by receiving a system reference clock (REFCLK) and then to block 404 by PLL locking the REFCLK. In various embodiments, the system reference clock REFCLK may be received by the reference clock selection circuit from a common clock source, which may located on a system level board of the computing system. In various embodiments, the common clock source may be an oscillator. In various embodiments, the reference clock selection circuit may be integrated in a memory buffer.

The method 400 may proceed to block 406 by initializing memory link training of a computing system to establish one or more links between a host and system memory. In various embodiments, the memory link training may be preceded by toggling a system reference clock.

The method 400 may proceed to block 408 by receiving a memory command clock (VCK). In various embodiments, the memory command clock VCK may be received by a reference clock selection circuit from the host.

The method 400 may proceed to block 410 by setting the memory command clock VCK as the memory buffer reference clock.

The method 400 may proceed to block 412 by providing the memory command clock VCK to a phase-lock loop (PLL). If it is determined at block 414 that the PLL has locked the memory command clock VCK, then the memory command clock VCK may be used for generating one or more other clocks at block 416. Then, the method 400 may proceed to block 418 by completing memory link training.

If, on the other hand, is it determined at block 414 that the PLL has failed to lock the memory command clock VCK, then the method 400 may proceed to block 420 by setting the system reference clock REFCLK as the memory buffer reference clock. The method 400 may then proceed to block 416.

Figure 5:
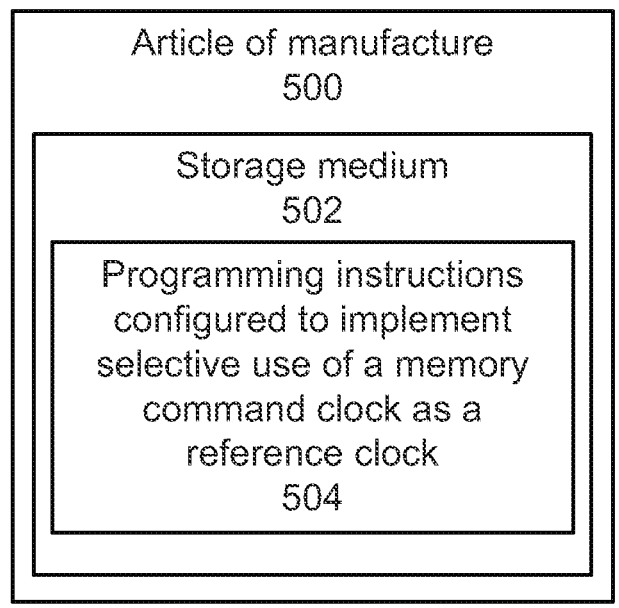
FIG. 5 illustrates an article of manufacture having programming instructions configured to cause an apparatus to practice some or all aspects of selectively setting a memory command clock as a reference clock (of the method of FIG. 4, for example)

In various embodiments, an article of manufacture may be employed to implement one or more methods as disclosed herein. FIG. 5 describes an example article of manufacture 500. As shown, the article of manufacture 500 may include a computer-readable non-transitory storage medium 502 having programming instructions 504. The programming instructions 504 may enable an apparatus, in response to their execution by the apparatus, to perform various operations described herein. For example, the non-transitory storage medium 502 may include programming instructions 504 configured to cause an apparatus or system to practice some or all aspects of selectively setting a memory command clock as a memory buffer reference clock of the method of FIG. 4, for example, in accordance with embodiments of the present disclosure.

The non-transitory storage medium 502 may represent a broad range of persistent storage medium known in the art, including but not limited to flash memory, dynamic random access memory, static random access memory, an optical disk, a magnetic disk, etc.

Figure 6:
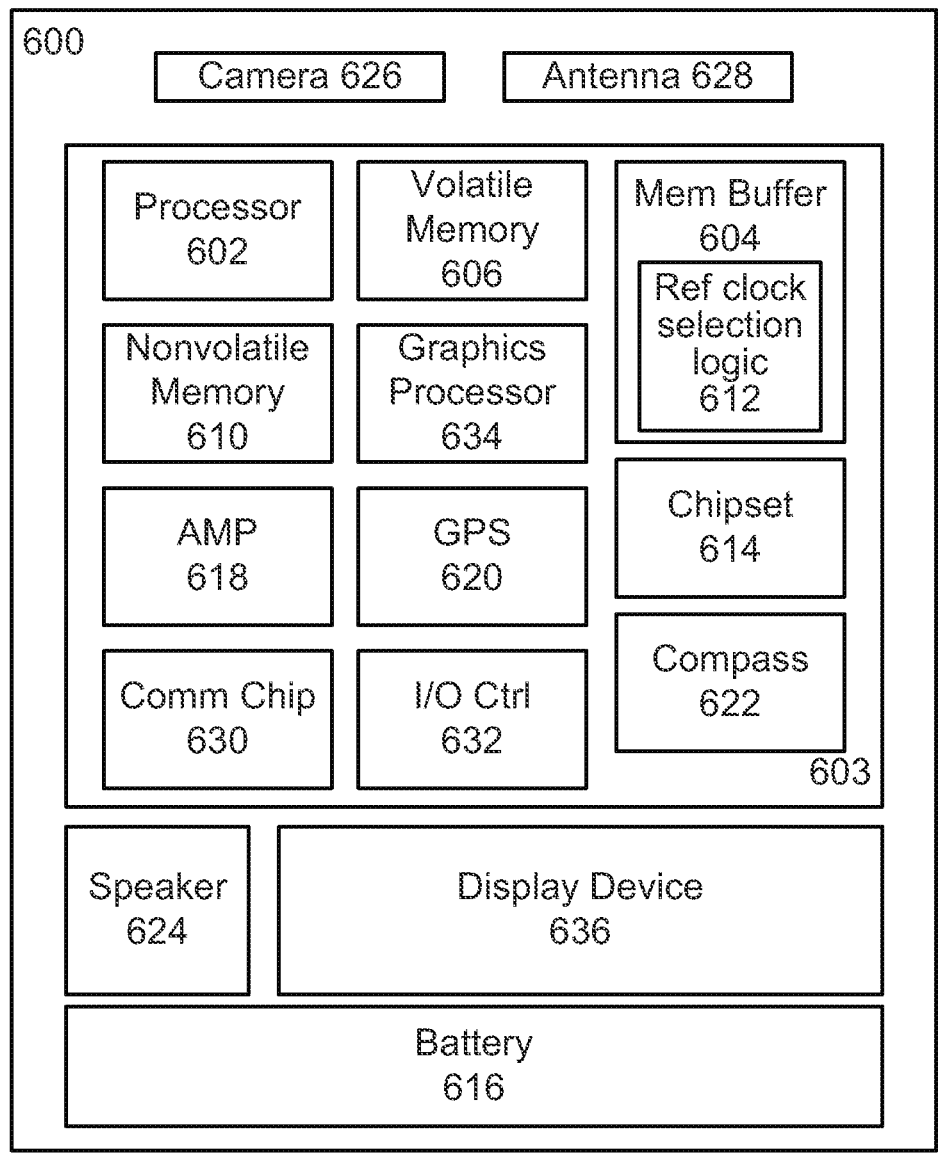
FIG. 6 is a block diagram of a system incorporating reference clock selection logic for selectively setting a memory command clock as a reference clock.

An embodiment of a system 600 incorporating a memory buffer 604 including reference clock selection logic 612 configured for selectively setting a memory command clock as a reference clock is illustrated in FIG. 6. Although not shown here, the reference clock selection logic 612 may include, for example, one or more components similar to those illustrated for the reference clock selection logic 312 of FIG. 3. In addition, although the reference clock selection logic 612 is shown here as being integrated with the memory buffer 604, in other embodiments the reference clock selection logic 612 may be a discrete component separate from the memory buffer 604. In various embodiments, the system 600 may include more or fewer components, and/or different architectures than that shown in FIG. 6.

In various implementations, the system 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the system 600 may be any other electronic device that processes data.

In various embodiments, the processor 602 may be physically and electrically coupled with the motherboard 603. Depending on its applications, the system 600 may include other components that may or may not be physically and electrically coupled to the motherboard 603. These other components include, but are not limited to, volatile memory 606 (e.g., dynamic random access memory (DRAM)), non-volatile memory 610 (e.g., read only memory (ROM)), flash memory, a graphics processor 634, a digital signal processor, a crypto processor, a chipset 614, a battery 616, an audio codec, a video codec, a power amplifier 618, a global positioning system (GPS) device 620, a compass 622, an accelerometer, a gyroscope, a speaker 624, a camera 626, an antenna 628, and a mass storage device (such as hard disk drive, compact disk (CD), digital versatile disk (DVD), and so forth).

The system 600 may include at least one communications chip 630 operatively to facilitate communication of the system 600 over one or more networks and/or with any other suitable device. The system 600 may also include at least one I/O controller 632, and in some implementations, the at least one I/O controller 632 may be part of the at least one communication chip 630. In some implementations the at least one communication chip 630 may be part of the processor 602.

The communication chip 630 may enable wireless communications for the transfer of data to and from the system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 630 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 2G, 3G, 4G, 5G, and beyond. In some implementations, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The system 600 may include a display device 636, such as, for example, a cathode ray tube (CRT), liquid crystal display (LCD), light emitting diode (LED), or other suitable display device. The display device 636 may be a touch screen display supporting touch screen features, and in various one of these embodiments, the I/O controller 632 may include a touch-screen controller. In various embodiments, the display device 636 may be a peripheral device interconnected with the system 600.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. An apparatus comprising:
a memory buffer configured to interface between a host and memory; and
reference clock selection logic coupled with the memory buffer and configured to selectively set a memory command clock as a memory buffer reference clock for the memory buffer, wherein the reference clock selection logic includes a multiplexer having inputs configured to receive a system reference clock and the memory command clock and an output configured to selectively output the memory command clock as the memory buffer reference clock.

2. The apparatus of claim 1, wherein the reference clock selection logic is configured to selectively set the memory command clock as the memory buffer reference clock as part of memory link training of the apparatus.

3. The apparatus of claim 1, wherein the multiplexer is configured to receive the system reference clock from a system clock and the memory command clock from a host.

4. The apparatus of claim 1, wherein the reference clock selection logic includes a phase-locked loop (PLL) coupled to the output of the multiplexer.

5. The apparatus of claim 4, wherein the reference clock selection logic is configured to cause the multiplexer to output the system reference clock if the PLL fails to lock the memory command clock.

6. The apparatus of claim 1, wherein the reference clock selection logic includes a reference clock selection state machine configured to provide a reference clock selection signal to the multiplexer, and wherein the multiplexer is configured to selectively output the memory command clock in response to the reference clock selection signal.

7. The apparatus of claim 6, wherein the reference clock selection logic includes a phase-locked loop (PLL) coupled to the output of the multiplexer, and wherein the reference clock selection state machine is configured to provide another reference clock selection signal to the multiplexer if the PLL fails to lock the memory command clock.

8. The apparatus of claim 1, wherein the reference clock selection logic includes a clock divider to receive the memory command clock and to generate one or more other clocks from the memory buffer reference clock.

9. The apparatus of claim 1, wherein the memory comprises a plurality of double data rate (DDR) memory modules.

10. The apparatus of claim 9, wherein the plurality of DDR memory modules comprise a plurality of DDR dynamic random access memory modules.

11. The apparatus of claim 1, wherein the reference clock selection logic is integrated into the memory buffer.

12. A system comprising:
a host;
a plurality of double data rate (DDR) memory modules;
a memory buffer configured to couple the host with the plurality of DDR memory modules;
reference clock selection logic configured to couple the memory buffer and the host, and to selectively set a memory command clock as a memory buffer reference clock for the memory buffer, wherein the reference clock selection logic includes a multiplexer having inputs configured to receive the memory command clock from the host and a system reference clock from an oscillator, and an output configured to selectively output the memory command clock; and
a display device coupled to the host.

13. The system of claim 12, wherein the reference clock selection logic is configured to selectively set the memory command clock as the memory buffer reference clock as part of memory link training.

14. The system of claim 12, wherein the reference clock selection logic includes a phase-locked loop (PLL) coupled to the output of the multiplexer.

15. The system of claim 14, wherein the reference clock selection logic is configured to cause the multiplexer to output the system reference clock if the PLL fails to lock the memory command clock.

16. The system of claim 14, wherein the reference clock selection logic includes a reference clock selection state machine configured to provide a reference clock selection signal to the multiplexer, and wherein the multiplexer is configured to selectively output the memory command clock in response to the reference clock selection signal.

17. The system of claim 12, wherein the reference clock selection logic is integrated into the memory buffer.

18. The system of claim 12, further comprising a network interface coupled with the host, and configured to communicatively couple the system with a network.

19. The system of claim 12, wherein the system is a selected one of a laptop, a netbook, a notebook, an ultrabook, a smartphone, a tablet, a personal digital assistant, an ultra mobile PC, a mobile phone, a desktop computer, a server, a printer, a scanner, a monitor, a set-top box, an entertainment control unit, a digital camera, a portable music player, or a digital video recorder.

20. The system of claim 12, wherein the display device is a touch screen display.

21. The system of claim 12, wherein the host includes one or more processors.

22. A method comprising:
receiving, by a memory buffer interfacing a host and memory, a system reference clock and a memory command clock;
selectively setting the memory command clock as the memory buffer reference clock;
providing the memory command clock to a phase-lock loop; and
selectively setting the system reference clock as the memory buffer reference clock if the phase-lock loop fails to lock the memory command clock.

23. The method of claim 22, further comprising performing memory link training to establish one or more links between the host and the memory, and wherein the selectively setting the memory command clock as the memory buffer reference clock is performed during the memory link training.

24. The method of claim 22, wherein the receiving the system reference clock comprises receiving the system reference clock by the memory buffer from a system clock, and wherein the receiving the memory command clock comprises receiving the memory command clock by the memory buffer from the host.

25. The method of claim 22, further comprising, after selectively setting the memory command clock as the memory buffer reference clock, generating one or more other clocks from the memory command clock.

26. A non-transitory machine-readable medium having associated instructions that, when executed by an apparatus, cause the apparatus to perform a method comprising:

providing to a memory buffer interfacing a host and memory, a system reference clock and a memory command clock;

selectively setting the memory command clock as the memory buffer reference clock;

providing the memory command clock to a phase-lock loop; and selectively setting the system reference clock as the memory buffer reference clock if the phase-lock loop fails to lock the memory command clock.

27. The non-transitory machine-readable medium of claim 26, wherein the operations further include initializing memory link training to establish one or more links between the host and the memory, and wherein the selectively setting the memory command clock as the memory buffer reference clock is performed during the memory link training.

* * * * *